(12) United States Patent
Geissler et al.

(10) Patent No.: US 10,490,527 B2
(45) Date of Patent: Nov. 26, 2019

(54) VERTICAL WIRE CONNECTIONS FOR INTEGRATED CIRCUIT PACKAGE

(71) Applicant: Intel IP Corporation, Santa Clara, CA (US)

(72) Inventors: Christian Geissler, Teugn (DE); Sven Albers, Regensburg (DE); Georg Seidemann, Landshut (DE); Andreas Wolter, Regensburg (DE); Klaus Reingruber, Langquaid (DE); Thomas Wagner, Regelsbach (DE); Marc Dittes, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/063,145

(22) PCT Filed: Dec. 18, 2015

(86) PCT No.: PCT/US2015/066766
§ 371 (c)(1),
(2) Date: Jun. 15, 2018

(87) PCT Pub. No.: WO2017/105502
PCT Pub. Date: Jun. 22, 2017

(65) Prior Publication Data
US 2018/0374819 A1     Dec. 27, 2018

(51) Int. Cl.
*H01L 23/52*     (2006.01)
*H01L 23/00*     (2006.01)
(Continued)

(52) U.S. Cl.
CPC ............ *H01L 24/85* (2013.01); *H01L 21/486* (2013.01); *H01L 21/4853* (2013.01);
(Continued)

(58) Field of Classification Search
CPC ............... H01L 21/4853; H01L 21/486; H01L 21/4889; H01L 21/4896; H01L 23/48;
(Continued)

(56) References Cited

U.S. PATENT DOCUMENTS 6,417,747 B1   7/2002  Dearden et al.
6,577,013 B1*  6/2003  Glenn ................ H01L 23/3114
                                                    257/618
(Continued)

FOREIGN PATENT DOCUMENTS

JP   2002324878 A    11/2002
TW     201733051 A     9/2017
WO  WO-2017105502 A1   6/2017

OTHER PUBLICATIONS

"International Application Serial No. PCT US2015 066766, International Preliminary Report on Patentability dated Jun. 28, 2018", 11 pgs.

(Continued)

*Primary Examiner* — Luan C Thai
(74) *Attorney, Agent, or Firm* — Schwegman Lundberg & Woessner, P.A.

(57) ABSTRACT

A method includes aligning a wire with a package body having a contact pad and moving the wire through the package body to form electrical contact with the contact pad.

22 Claims, 10 Drawing Sheets

(51) Int. Cl.

| | |
|---|---|
| *H01L 23/48* | (2006.01) |
| *H01L 25/065* | (2006.01) |
| *H01L 21/48* | (2006.01) |
| *H01L 23/538* | (2006.01) |
| *H05K 1/18* | (2006.01) |
| *H05K 3/40* | (2006.01) |
| *H05K 3/00* | (2006.01) |
| *H05K 3/46* | (2006.01) |
| *H01L 23/498* | (2006.01) |

(52) U.S. Cl.
CPC ...... *H01L 21/4889* (2013.01); *H01L 21/4896* (2013.01); *H01L 23/48* (2013.01); *H01L 23/538* (2013.01); *H01L 24/48* (2013.01); *H01L 24/49* (2013.01); *H01L 25/065* (2013.01); *H01L 25/0652* (2013.01); *H05K 1/185* (2013.01); *H05K 3/4046* (2013.01); *H01L 23/49816* (2013.01); *H01L 23/49822* (2013.01); *H01L 23/49827* (2013.01); *H01L 2224/04105* (2013.01); *H01L 2224/16146* (2013.01); *H01L 2224/16238* (2013.01); *H01L 2224/19* (2013.01); *H01L 2224/20* (2013.01); *H01L 2224/45015* (2013.01); *H01L 2224/45139* (2013.01); *H01L 2224/45144* (2013.01); *H01L 2224/45147* (2013.01); *H01L 2224/45664* (2013.01); *H01L 2224/48091* (2013.01); *H01L 2224/48105* (2013.01); *H01L 2224/48228* (2013.01); *H01L 2224/73204* (2013.01); *H01L 2224/85186* (2013.01); *H01L 2924/181* (2013.01); *H05K 3/007* (2013.01); *H05K 3/4644* (2013.01); *H05K 2201/10287* (2013.01)

(58) Field of Classification Search
CPC ....... H01L 23/538; H01L 24/48; H01L 24/85; H01L 24/49; H01L 25/065; H01L 25/0652
USPC ........................................................ 257/784
See application file for complete search history.

(56) References Cited

U.S. PATENT DOCUMENTS

| | | | | |
|---|---|---|---|---|
| 6,908,785 | B2* | 6/2005 | Kim | H01L 21/76898 257/E21.597 |
| 7,663,232 | B2* | 2/2010 | Kinsley | H01L 24/72 |
| 7,682,962 | B2* | 3/2010 | Hembree | B23K 20/004 438/617 |
| 7,906,846 | B2* | 3/2011 | Hoshino | H01L 21/6835 257/723 |
| 8,253,256 | B2* | 8/2012 | Jo | H01L 21/76898 257/686 |
| 8,421,241 | B2* | 4/2013 | Meghro | H01L 23/49517 257/666 |
| 2008/0185708 | A1 | 8/2008 | Chen et al. | |
| 2009/0250800 | A1 | 10/2009 | Harayama et al. | |
| 2009/0289336 | A1 | 11/2009 | Meghro et al. | |

OTHER PUBLICATIONS

"International Application Serial No. PCT/US2015/066766; International Search Report dated Aug. 18, 2016", 3 pgs.
"International Application Serial No. PCT/US2015/066766, Written Opinion dated Aug. 18, 2016", 9 pgs.

* cited by examiner

FIG. 9

VERTICAL WIRE CONNECTIONS FOR INTEGRATED CIRCUIT PACKAGE

CLAIM OF PRIORITY

This patent application is a U.S. National Stage Application under 35 U.S.C. 371 from International Application No. PCT/US2015/066766, filed Dec. 18, 2015, published as WO 2017/105502, which is incorporated herein by reference.

TECHNICAL FIELD

Embodiments described herein generally relate vertical connections in integrated circuit packages, and more particularly to use of vertical wire connections for integrated circuit packages.

BACKGROUND

System in Package (SiP) integration is a major trend in the semiconductor packaging industry to reduce system form factor, costs and increase performance. Typical approaches are side by side (SbS) die arrangements, 3D die stacking (3D) and package on package (PoP) stacking.

Creating vertical interconnects for PoP and 3D is an expensive and space consuming factor. Due to needed production steps (e.g. etching, plating etc.), through silicon vias (TSVs) are very expensive, which makes an introduction for low cost packages critical. Through mold vias (TMVs) are typically realized either via embedded contact bars or laser drilling followed by a metal filling process. Both approaches require quite large design rules (DRs).

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

System in package (SiP) vertical interconnects may be formed by shooting or pressing conductive wires, nails, or screws for example, hereinafter referred to as wires, through a package body. The wires are connected to contact pads at different z-height levels in the package such as by press fits similar to that used in a wirelast through mold via (TMV) interconnects. The so formed vertical interconnects may provide one or more of a space saving, cheap approach with a higher flexibility for connecting components placed in different z-heights. Further advantages, when compared to prior TMV solutions, may include one or more of smaller interconnect pitch, lower process costs, variable interconnect diameters, higher connection flexibility, and low temperature process, enabling connection possibilities for components at low thermal budget.

Compared to Bond-Via Array (BVA) technologies, which utilize a wirebonded interconnect array embedded into a mold compound (MC), wire or nail shooting or pressing is not limited by a ball pitch of a top package previously used to couple to wire extensions. Further, no mold deflash process nor bond pads on a bottom substrate are utilized as in BVA.

Figure 1:
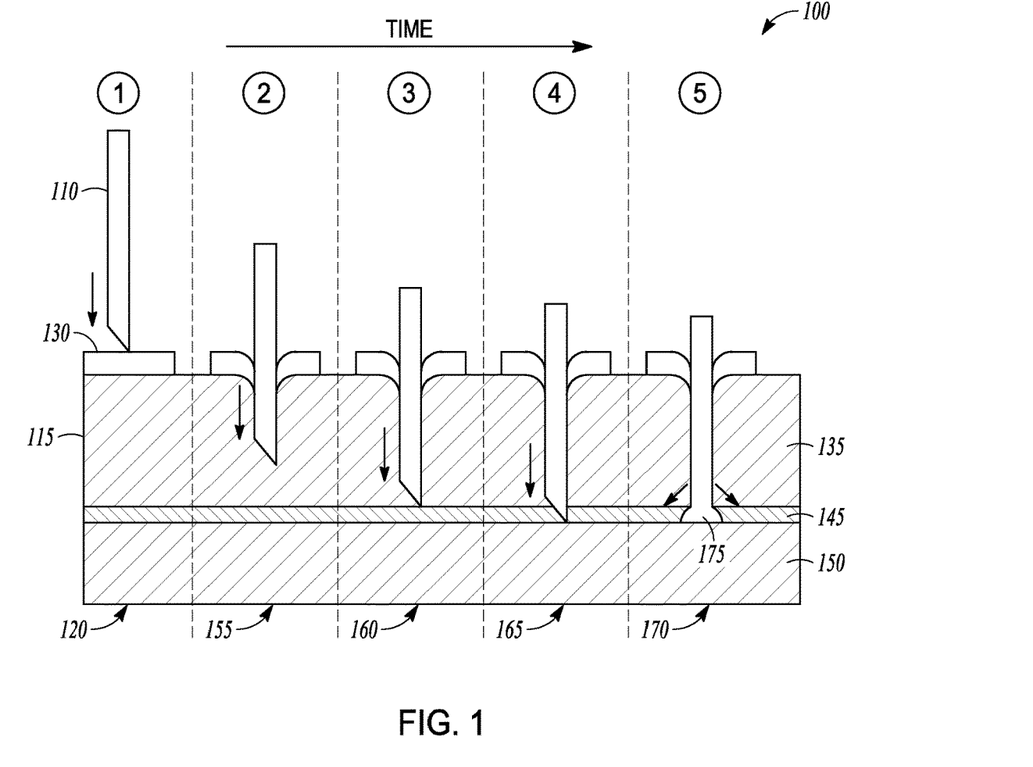
FIG. 1 is cross sectional time lapse view of a wire being moved through a package to contact a contact pad according to an example embodiment.

FIG. 1 is a time lapse cross section representation 100 of a wire 110 being moved through a package body 115. At 120, the wire 110 is aligned with the package body 115 having a contact pad 130 supported by a layer 135 of the package body 115. In one embodiment, the wire 110 may be aligned with a conductive pad 130, which may be formed of copper or other conductive material. Layer 135 in one embodiment may be a dielectric material. An adhesion layer 145, such as adhesion tape may couple the dielectric material to a rigid carrier 150. Time elapsed views 155, 160, 165 and 170 illustrate the wire 110 being moved through the pad 130, layer 135, and adhesion layer 145 to make contact with the rigid carrier 150. As seen in view 170, the wire may spread out as illustrated at 175.

Multiple wires may be used to create a fan-out package fixed on the rigid carrier system 150. The wire 110 may be moved by shooting or pressing in various embodiments. Shooting may utilized compressed air to accelerate the wire through a tube with a diameter slightly larger than a diameter of the wire. An amount of force and speed utilized for either method will be a function of the thickness of the wire 110 and the pliability and other characteristics of the materials the wire is being moved through. In some embodiments, the dielectric or other mold material may be partially cured prior to moving the wire through, and then further cured to a final cured state after the wires have been so moved.

In various embodiments, the wire comprises a conductive wire or nail such as for example an Au-wire or Cu-wire with Pd coating. A suitable wire composition may be chosen to allow mechanical intrusion of the contact pad 140 to avoid wire or nail deformation during processing.

As the wire 110 is driven through the contact pad 130, a 360° sliding contact with the contact pad 130 metal is formed, and the wire intrudes into the dielectric material 135 below the contact pad 130 as seen in view 155. The sliding contact in one embodiment is a result of deformation of the contact pad 130, which manifests with the pad 130 about the wire being bent downward along the wire. The dielectric 135 material should not be filled or brittle. One example material comprises polyimide (EtB>10% at 25° C.). Other similar materials may be used. The dielectric 135 may be partially cured to allow for easy wire penetration. Final curing could then be done at a later step.

After the wire 110 has passed the dielectric material as seen in view 160, the wire 110 reaches the adhesion layer 145 which fixes the dielectric material to the carrier system. The wire 110 is then moved through the soft adhesion layer 145 and reaches the surface of the carrier 150 as seen in view 165.

The wire 110 does intrude into the rigid carrier material which may be formed of a rigid material such as steel, carbon, or other suitable rigid material. The kinetic energy of the wire 110 leads to a plastic deformation of the bottom end of the wire as indicated at 175 in the area of the soft adhesion layer 145. This allows formation of a later contact area on one level of all processed wires/nails which can be connected following carrier 150 debonding by a frontside redistribution layer (RDL)-process. On the topside of the package the portion of the wire 110 not moved through the package can be cut slightly above the contact pad 130, or in further embodiments, bent and coupled to another contact pad. To improve a sliding contact resistance, an ultrasonic wave can be coupled into the topside end of the wire as may be typically done for wedge bonding processes.

The same wire movement process, referred to as wire last TMV, can be applied to drive through more stacked contact pad/dielectric layers.

Figure 2:
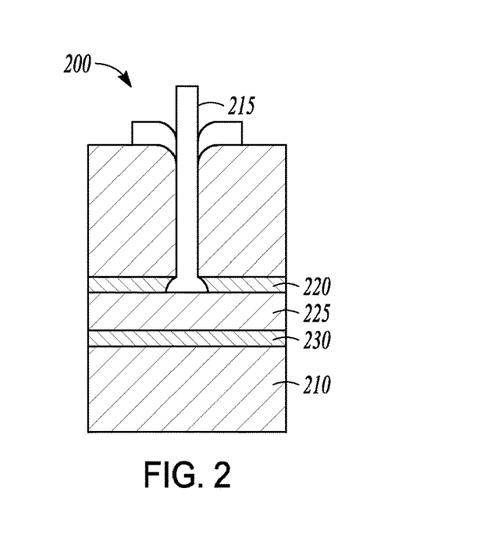
FIG. 2 is a cross sectional view of an alternative package with a wire forming contact with a contact pad according to an example embodiment.

FIG. 2 illustrates an alternative package at 200. To ensure that a carrier 210 is not damaged by an intruded wire 215, or to avoid mechanical connection of wires on carrier the adhesion layer 145 of FIG. 1 can be replaced by an adhesion layer 220, rigid layer 225, and adhesion layer 230 stack to enable secure carrier debonding. The rigid layer in between may be an additional carbon layer.

Figure 3A:
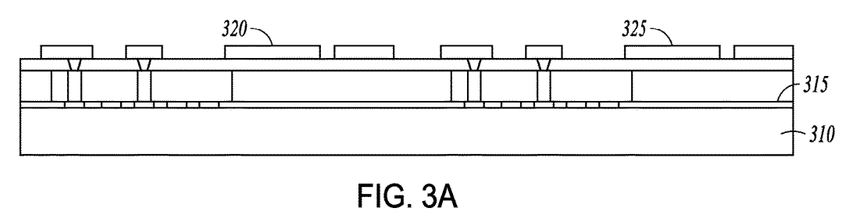
FIGS. 3A, 3B, 3C, 3D, 3E, 3F, 3G, 3H, 3I, 3J, 3K, and 3L are cross section diagrams illustrating an example process flow for integrating wire interconnects according to an example embodiment.

FIGS. 3A, 3B, 3C, 3D, 3E, 3F, 3G, 3H, 3I, 3J, 3K, and 3L illustrate an example process flow for integrating the wire last TMV interconnect in to a fan out wire last (FOWL) SiP. FIG. 3A shows a carrier 310 having multiple components coupled to the carrier 310 by adhesion tape 315. Two contact pads are identified at 320 and 325.

Figure 3B:
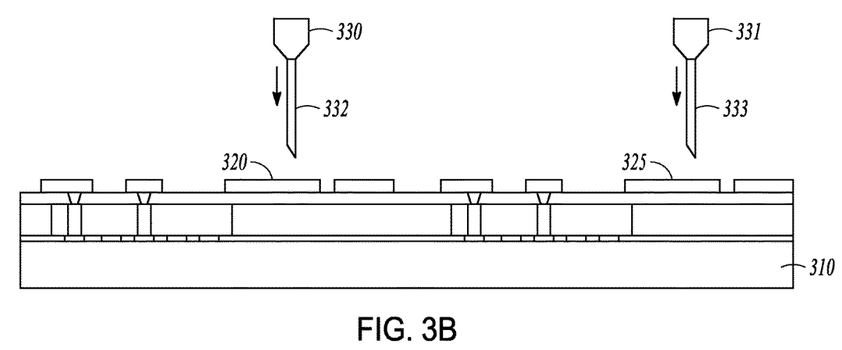
Figure 3C:
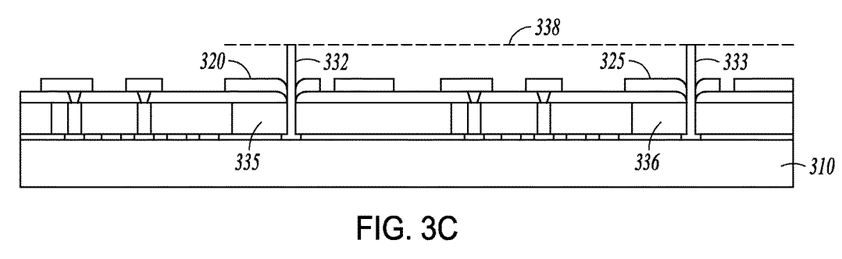

FIG. 3B illustrates mechanisms 330 and 331 to shoot wires 332, 333 through the contact pads 320 and 325 respectively. The mechanisms 330 and 331 are aligned such that the wires 332 and 333 first contact the contact pads 320 and 325, and then proceed through dielectric layers 335, 336 as shown in FIG. 3C. The wires 332 and 333 may be cut to a broken line 338 which is slightly above an RDL.

Figure 3D:
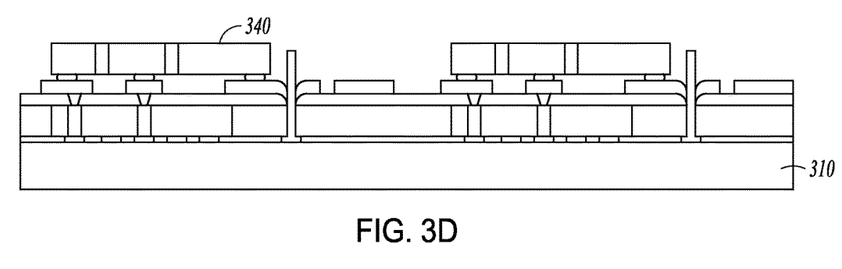
Figure 3E:
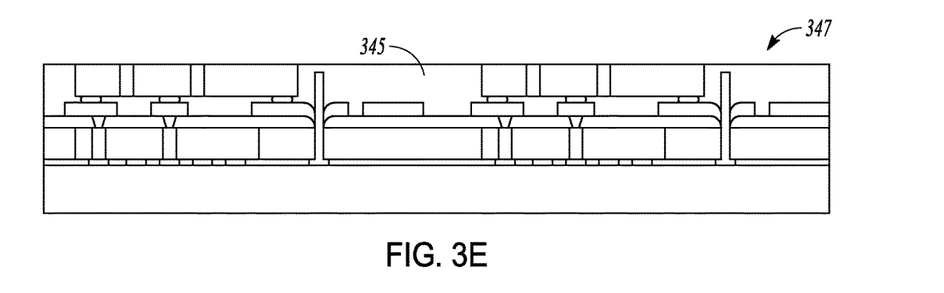
Figure 3F:
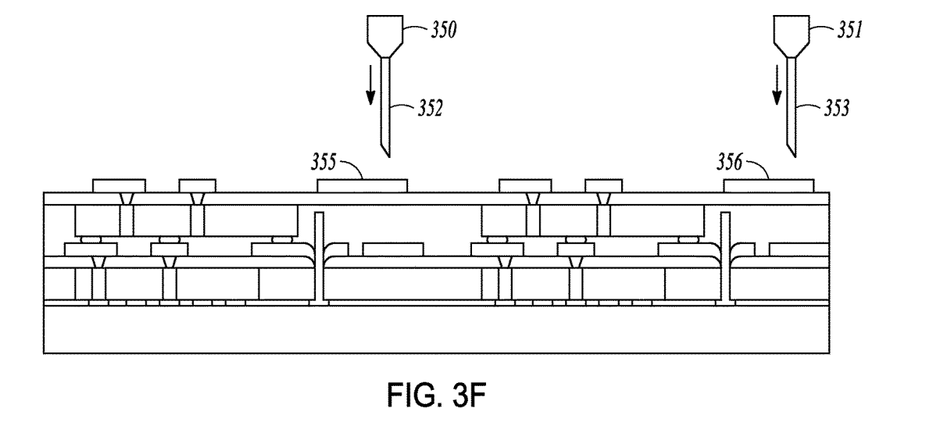
Figure 3G:
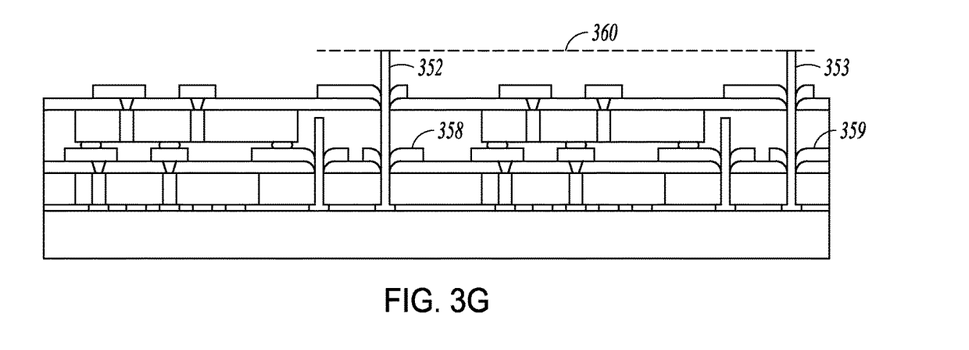

In one embodiment, an additional die may be attached as indicated at 340 in FIG. 3D. A further dielectric layer 345 and back grinding may be performed, resulting in the two layer device 347 indicated in FIG. 3E. FIG. 3F shows additional mechanisms 350, 351 aligned to shoot wires 352, 353 through additional contacts 355, 356 formed on device 347. Wires 352 and 352 are shown as penetrating further contact pads indicated at 358 and 359 on a layer beneath the recently added layer 345. Wire 352 and 353 cutting to an RDL level indicated by broken line 360.

Figure 3H:
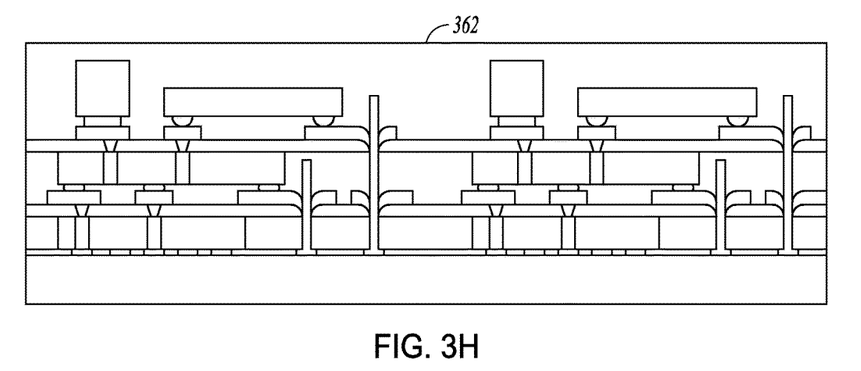
Figure 3I:
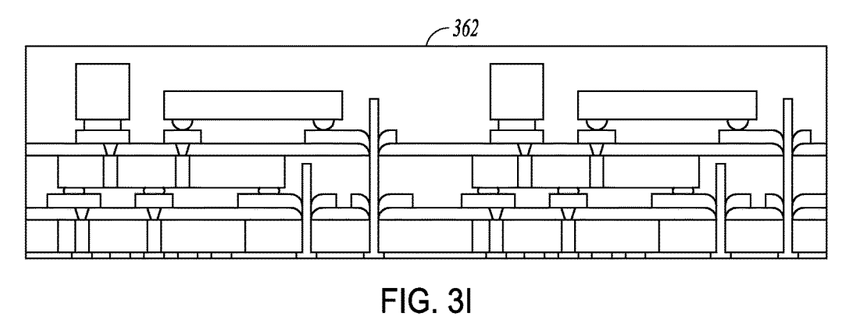
Figure 3J:
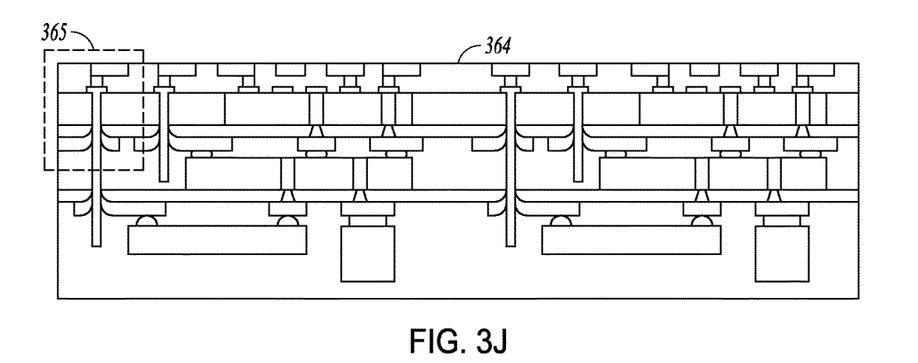
Figure 3K:
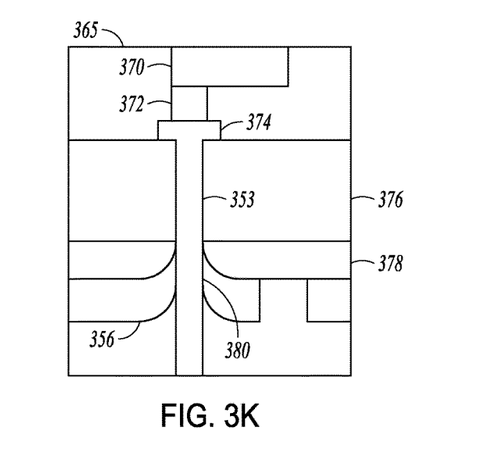

FIG. 3H illustrates the placement of additional components and formation of a mold compound 362 around the additional components. In FIG. 3I, the carrier 310 has been removed. In FIG. 3J, the package has been flipped such that the bottom where the carrier was attached is now on top for further processing and formation of contacts to the wire bottoms enclosed in a dielectric layer 364. FIG. 3K is an enlarged view of an area enclosed by broken line 365 in FIG. 3J. A contact 370 is coupled by a via 372 to a bottom side 374 of the wire 353, which is shown having been moved through an embedding material 376 and dielectric 378 and also making sliding contact 380 with contact 356.

Figure 3L:
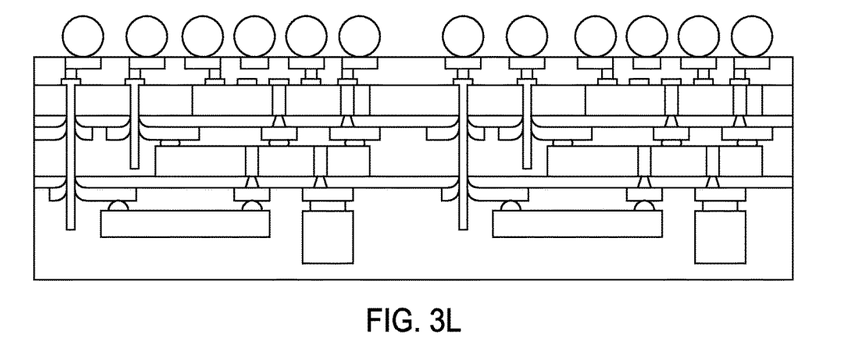

FIG. 3L shows a further step of adding solder balls to exposed contact areas, allowing attachment to other packages or off chip conductors.

Figure 4:
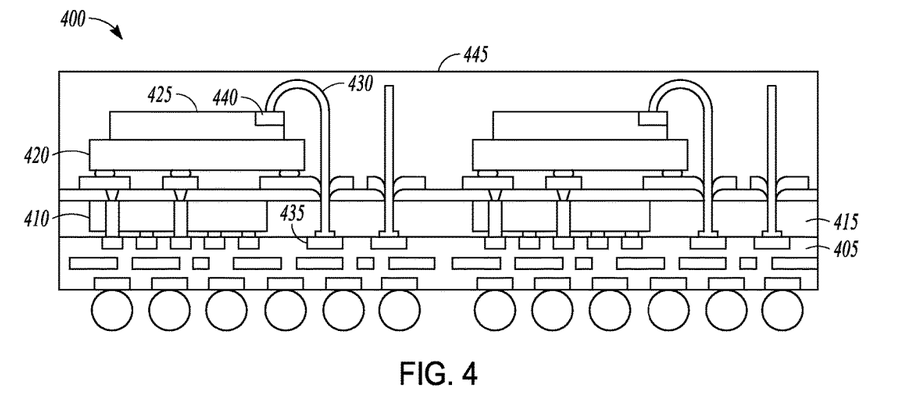
FIG. 4 is a cross section diagram illustrating use of moved wires for a flip chip according to an example embodiment.

FIG. 4 shows the application of wire last TMV for a flip chip (FC) SiP indicated generally at 400. On a FC substrate 405, a first top die 410 is attached and embedded into a soft unfilled embedding material 415 such as a soft dielectric. A backside metallization is applied, on which a further die 420 is attached. On the backside of the die 420 another die 425 is attached with its backside. A wire last TMV 430 may connect from back side (BS-RDL) to a substrate pad 435 and additionally the topside wire end may be bent such that it can be wedge bonded to a pad 440 on the topside of die 425. Finally the SiP is embedded into mold compound 445. The wire last TMV allows much smaller contact pitch than TMVs formed by via bars or solder balls, which typically are in the range of 0.3 to 0.5 mm. Typical wire diameter are in the range of 10-30 µm, so a pitch of 0.1 mm and below is possible.

Figure 5A:
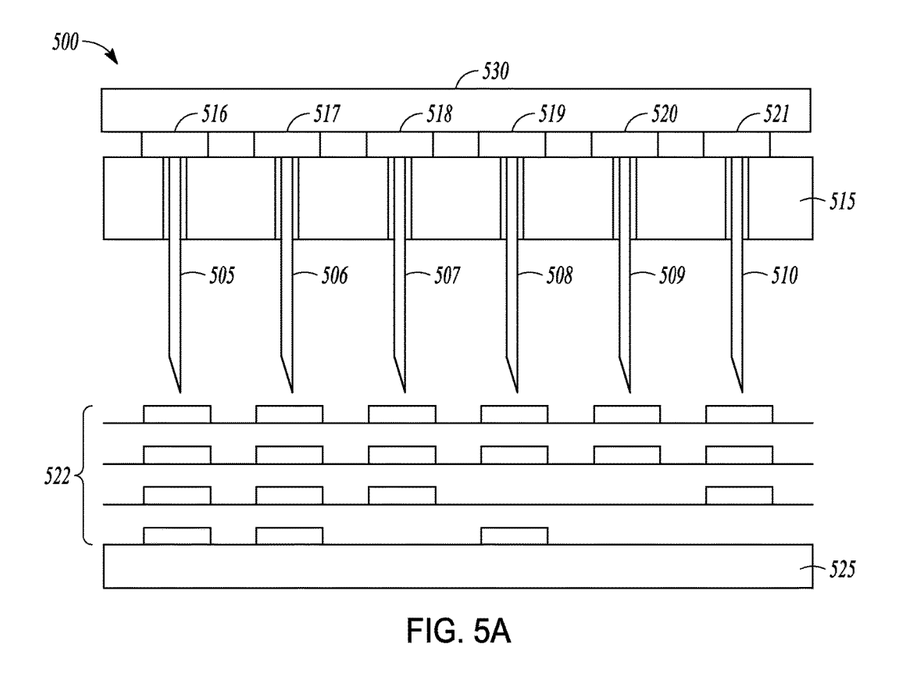
FIGS. 5A, 5B, 5C, and 5D illustrate in cross section, a method of driving multiple wires through routing layers according to an example embodiment.
Figure 5B:
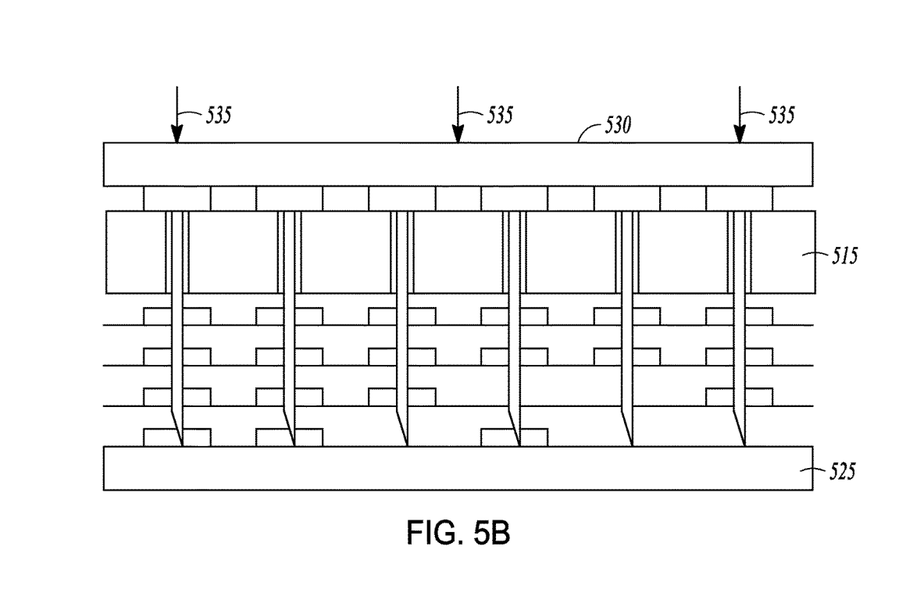

FIGS. 5A, 5B, 5C, and 5D illustrate in cross section at 500, a method of driving multiple wires. Wires are shown at 505, 506, 507, 508, 509 and 510 arranged in a stencil 515. In one embodiment the wires may be in the form of nails with heads indicated at 516, 517, 518, 519, 520, and 520. The stencil 515 with wires is aligned over multiple package routing layers indicated at 522 which are supported by a carrier 525. A top plate 530 is used to induce a parallel pressing force 535 on the aligned stencil 515 and wires 505-510 as shown in FIG. 5B.

Figure 5C:
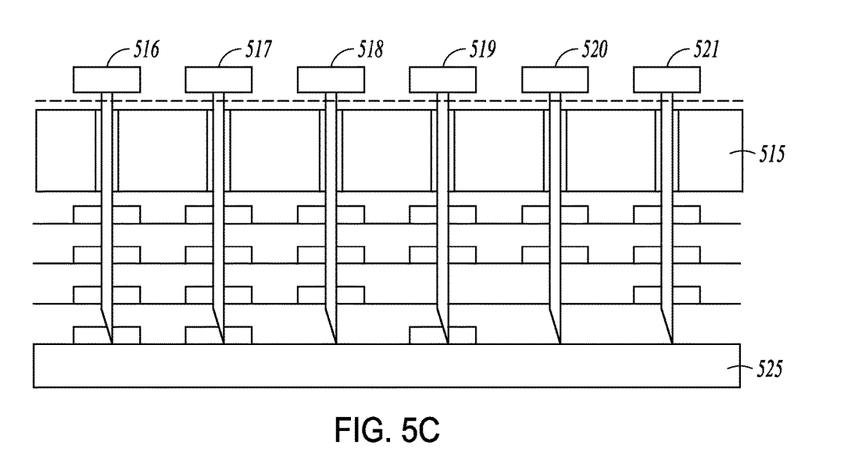
Figure 5D:
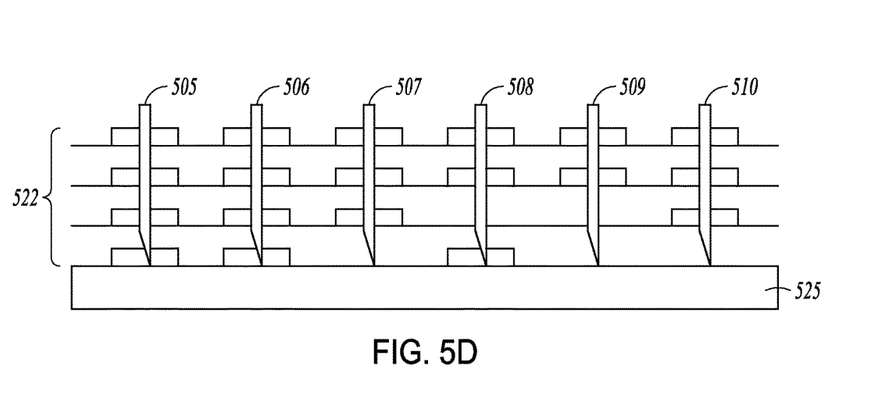

FIG. 5C illustrates removal of the top plate 530 and a slight lowering of the stencil 515 such that the wire or nail heads 516-521 are exposed sufficiently to facilitate cutting off of the nail heads and removal of the stencil and nail heads as indicated in FIG. 5D. Note that the carrier provides a good stop for the nails which may be electrically coupled to multiple contact pads through the multiple different layers of the package routing layers 522. In a further embodiment, the stencil 515 may be properly aligned, and wires without heads may be inserted into the stencil which is located a distance from the top of the package routing layers that is about the same as the length of the wires. The top plate should then be sufficiently rigid to prevent penetration of the top plate by the wires as the force is applied. The stencil may then be removed after the wires are driven a sufficient distance to accomplish all desired connections, and the exposed portions of the wires may be trimmed if needed.

In some embodiments, different wire thicknesses or materials may be used and individually moved or moved in parallel with a stencil designed to accommodate the various thicknesses. Depending on maximum current requirements single wire or nail interconnects may have diameter variations between 10 µm and 100 µm for example. Other diameters and non-round wire cross sections may be used in further embodiments. A tip of the wire that first penetrates the various structures during movement may be tapered to facilitate movement. The taper may occur toward one side as shown in several of the figures, or the taper may be symmetric about a center axis of the wire, forming a needle like structure. In further embodiments, no taper may be used.

The wires may be formed of Cu or Au or Ag or using specific alloys like specific Al-alloys or FeNi. Other materials may be used in further embodiments. To optimize contact resistance, the metal pads and or wires/nails might contain solder to create a solder joint between wire/nail and metal pad after a reflow process, such as a final ball apply reflow. The solder could be deposited or coated on the pad. Alternatively it could be coated on the wire. Material and geometry tuning allows perfect adaption to the electrical requirements.

Figure 6A:
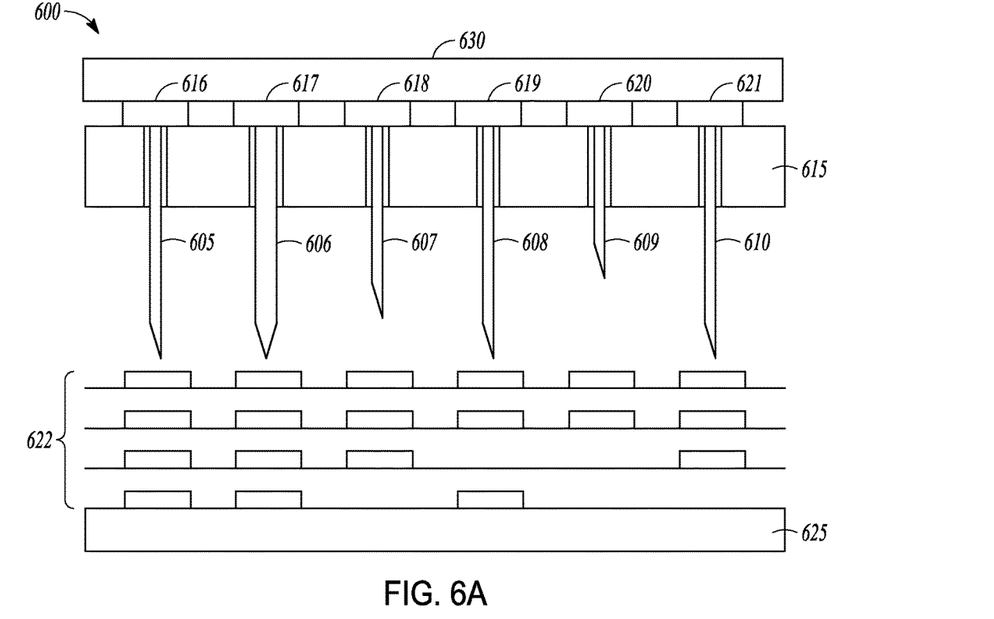
FIGS. 6A, 6B, 6C, and 6D illustrate in cross section, a method of driving multiple wires having different lengths and diameters or thicknesses according to an example embodiment.
Figure 6B:
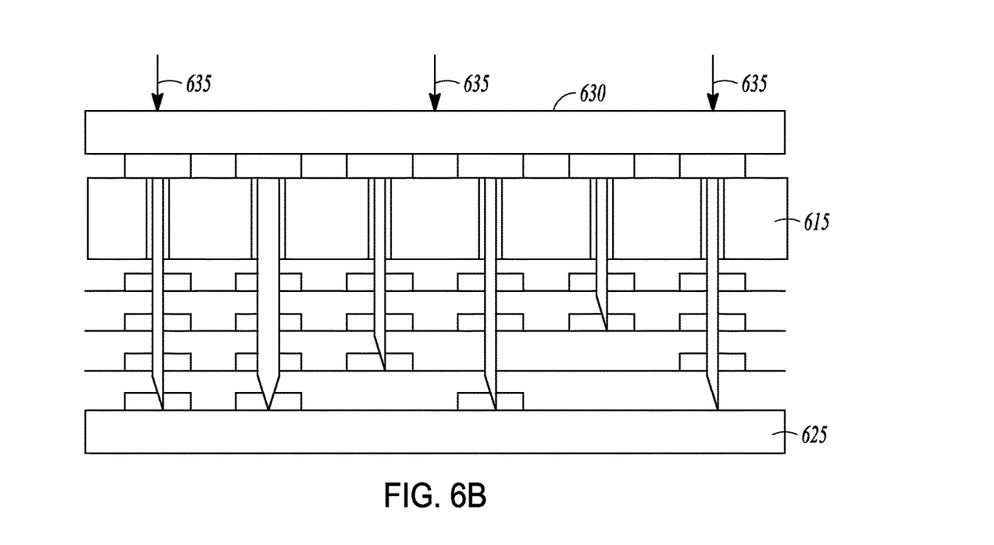

FIGS. 6A, 6B, 6C, and 6D illustrate in cross section at 600, a method of driving multiple wires having different lengths and diameters or thicknesses. Wires are shown at 605, 606, 607, 608, 609 and 610 arranged in a stencil 615. In one embodiment the wires may be in the form of nails with heads indicated at 616, 617, 618, 619, 620, and 621. The stencil 615 with wires is aligned over multiple package routing layers indicated at 622 which are supported by a carrier 625. A top plate 630 is used to induce a parallel pressing force 635 on the aligned stencil 615 and wires 605-610 as shown in FIG. 6B.

Figure 6C:
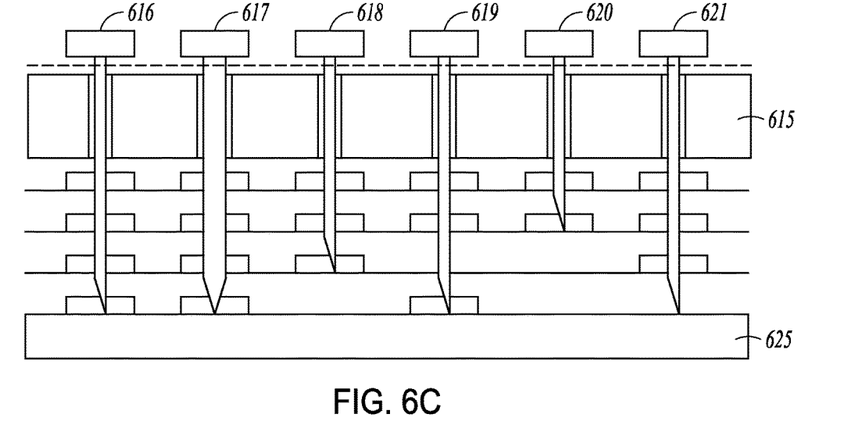
Figure 6D:
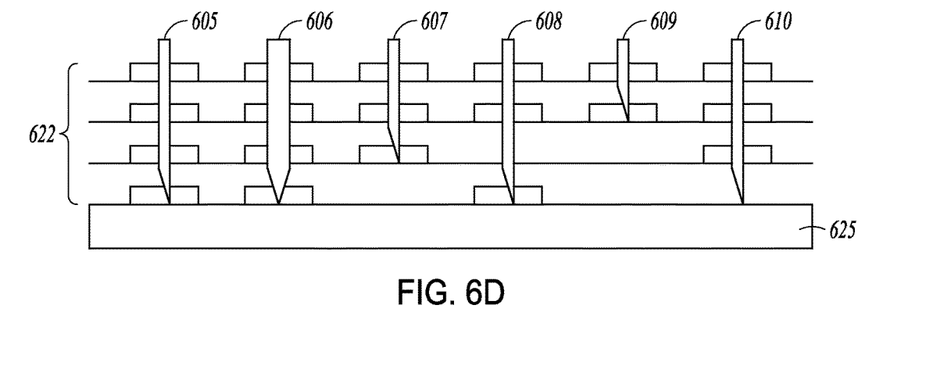

FIG. 6C illustrates removal of the top plate 630 and a slight lowering of the stencil 615 such that the wire or nail heads 616-621 are exposed sufficiently to facilitate cutting off of the nail heads and removal of the stencil and nail heads as indicated in FIG. 6D. Note that the carrier may provide a good stop for some of the longer wires 605, 606, and 608, which may be electrically coupled to multiple contact pads through the multiple different layers of the package routing layers 622. Wire 607 is shorter than wires 605, 606, and 608, and only penetrates to a third wiring layer. Wire 609 is even shorter, and penetrates two layers. Wire 610 penetrates a contact pad on the third layer, but does not reach the carrier 625.

Also, note that the wires have varying thickness, with wire 606 being the thickest, enabling it to reliably carry a larger current. The length of each nail can be adapted to the SiP-design to connect e.g. only 2 upper layers but not the bottom routing layer. Nail or wire penetration might alternatively stop in the solder of a solder coated bottom contact pad or might stop inside of the dielectric material below the contact pad. Nail thickness might be increased to drive large peak currents or to use it as a thermal dissipation path.

Figure 7:
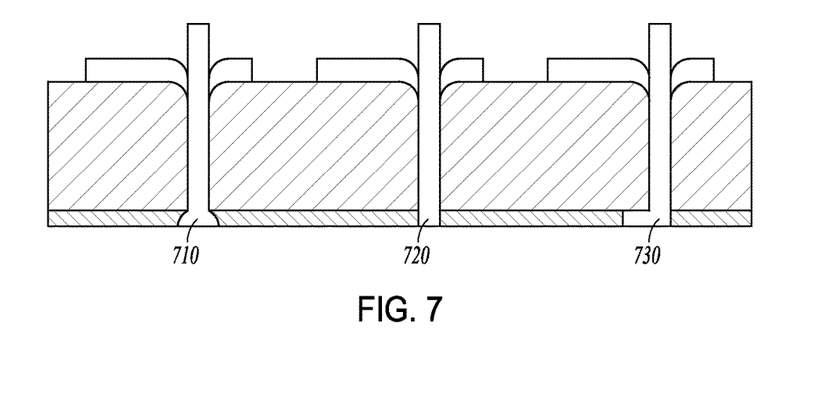
FIG. 7 illustrates different wire end deformations after being moved according to an example embodiment.

Depending on process, material and geometry the shape of the bottom wire might change as illustrated in three example ways in FIG. 7, which are cross sections of wired that have been moved through a package. In one example, a cross section of a wire head 710 shows that the head spreads on contact with an impenetrable carrier. For hard wire or nail material and well controlled process it might be possible that no deformation of the end takes place as illustrated at 720. In other cases an asymmetric deformation might take place or might be targeted as indicated by an "L" shape at 730, where the end of the wire undergoes a 90 degree turn.

Figure 8:
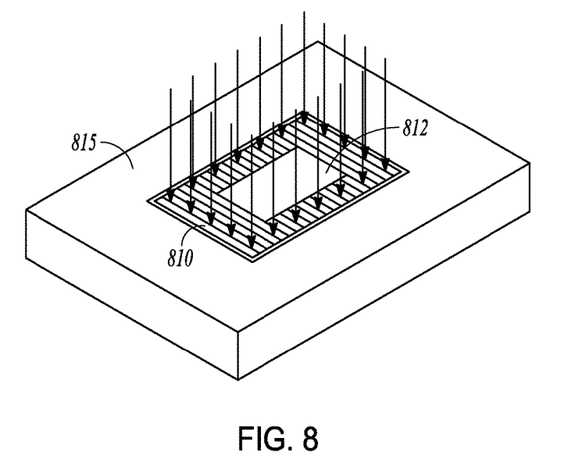
FIG. 8 is a perspective view of wires forming interconnects between a package containing a die to a printed circuit board according to an example embodiment.

FIG. 8 illustrates an application of wire last approach to form interconnects between a package 810 containing a die 812 to a printed circuit board (PCB) 815, replacing the typical solder balls.

Figure 9:
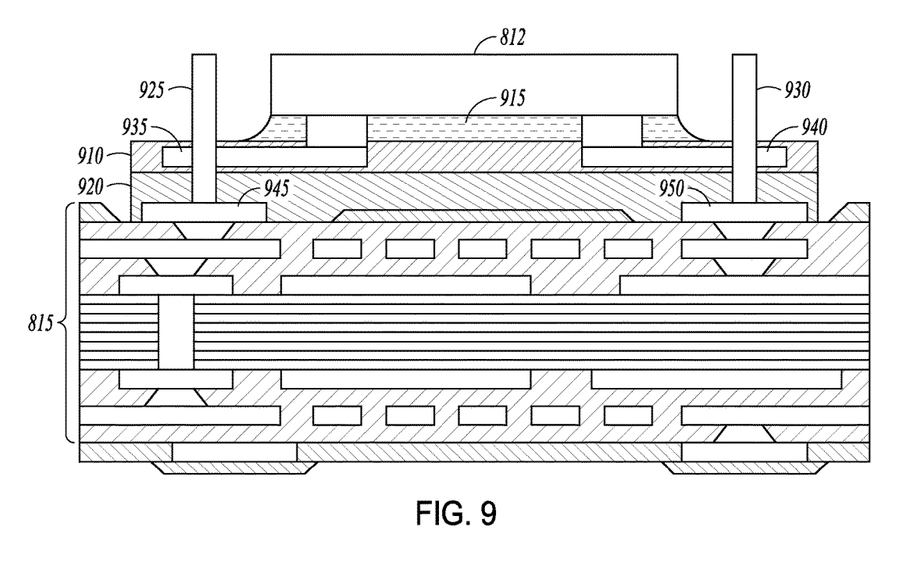
FIG. 9 is a cross section representation of the wires forming interconnects between a package containing a die to a printed circuit board of FIG. 8.

FIG. 9 illustrates the application of the wire last approach in cross section. The die 812 may be supported by a thin 1 layer substrate 910, such as a substrate consisting of an organic material. After die 812 attach on substrate 910 including an underfill application substrate 915, the bottom side may be covered by an additional non-conductive underfill 920, glue or adhesion tape to fix the substrate 910 with a defined standoff on the PCB 815. Then the wire last connection is applied. Shooting or pressing e.g. cu wires 925, 930 through contact pads 935, 940 in the fanout area to connect it with PCB contact pads 945, 950. Additional ultrasonic process may be applied to improve contact resistance.

To reduce processing time e g nails can be applied arranged via stencil and then pressed with high force in parallel on substrate and PCB stack. Some advantages of this process for board assembly may include the elimination of the use of reflow processes utilized in prior standard solder joint interconnects which utilize two reflow processes, one after ball attach and one during board assembly reflow process. A further benefit may include the package standoff not depending anymore on solder ball diameter. Package standoff may be directly controlled by applying different glue or adhesion tape thicknesses on package bottomside. Interconnect pitch to PCB can be reduced because solder ball bridging is not an issue with the new method. Wire thickness and material can be adapted for different interconnects inside of one package to address different electrical, thermal or mechanical requirements without impact on package standoff.

To better illustrate the electronic assemblies, electronic packages and methods disclosed herein, a non-limiting list of examples is provided herein:

Example 1 includes a method of forming wire connections including aligning a wire with a package body having a contact pad. The wire is moved through the package body to form electrical contact with the contact pad.

Example 2 includes the subject matter of example 1 wherein moving the wire through the package body forms electrical contact with multiple contact pads at different levels of the package body.

Example 3 includes the subject matter of example 1 wherein the package body comprises dielectric material.

Example 4 includes the subject matter of example 3 wherein the package body comprises an adhesion layer between a top of the package body and the contact pad, and wherein the wire is moved through the contact pad, the dielectric layer, and the adhesion layer to a rigid carrier supporting the package body.

Example 5 includes the subject matter of example 4 and further comprises deforming a tip of the wire during moving the wire as the tip of the wire contacts the rigid carrier.

Example 6 includes the subject matter of example 3 and further comprising curing the dielectric material following the formation of the electrical contact with the contact pad.

Example 7 includes the subject matter of example 1 wherein the wire has a tip with a reduced cross section on a portion of the wire first contacting the body package as the wire is moved through the body package.

Example 8 includes the subject matter of example 1 wherein multiple wires are aligned with respect to multiple contact pads and moved through the package to form electrical contact with respective contact pads.

Example 9 includes the subject matter of example 8 wherein at least one of the respective contact pads is on a different level of the package body.

Example 10 includes the subject matter of any of examples 1-9 wherein the wire comprises gold.

Example 11 includes the subject matter of any of examples 1-9 wherein the wire comprises copper.

Example 12 includes the subject matter of any of examples 1-9 wherein the wire is moved by pressing the wire through the package body.

Example 13 includes the subject matter of examples 1-9 wherein the wire is moved by shooting the wire through the package body.

Example 14 includes a method of forming wire connections including aligning a first wire with an integrated circuit system in package having a first contact pad supported by a first layer of a package body. The first wire is moved through the package body to form electrical contact with the contact pad. A second layer is added to the package body. The method also includes aligning and moving a second wire through the second layer of the package body to form electrical contact with a second contact pad.

Example 15 includes the subject matter of example 14 and further including removing a carrier from the first layer of the package body, flipping the package body, and adding components coupled to the contact pads of the first layer.

Example 16 includes the subject matter of example 15 and further including forming a mold compound about the components.

Example 17 includes the subject matter of any of examples 14-16 and further including bending at least one of the first and second wires to contact a pad of one of the components and forming a mold compound about the components and wires.

Example 18 includes a method of forming wire connections including arranging wires in a stencil, aligning the stencil to position the wires above selected contact pads of a stack of multiple routing layers, moving the wires in the stencil to contact multiple contact pads on different routing layers, and removing the stencil.

Example 19 includes the subject matter of example 18 wherein the wires are moved by applying pressure to a rigid plate contacting the stencil and wires.

Example 20 includes the subject matter of example 19 wherein the wires comprise nails having heads, the method further comprising removing the heads after moving the wires and prior to removing the stencil.

Example 21 includes the subject matter of any of examples 18-20 wherein at least one wire is shorter than other wires such that the shorter wire does not contact a lowest routing layer after the wires have been moved.

Example 22 includes the subject matter of any of examples 18-20 wherein at least one wire is thicker than other wires.

Example 23 includes the subject matter of example 21 wherein the thicker wire is positioned to conduct heat from a package coupled to the routing layers.

Example 24 includes the subject matter of any of examples 18-20 wherein a tip of one of the wires spreads out responsive to being moved to contact one of the contact pads.

Example 25 includes a device formed by any one of examples 1-24.

Example 26 includes an electronics package device including a wiring layer having a contact pad, the wiring layer formed of a dielectric material. A wire extends through the contact pad, the contact pad being deformed about the wire, forming a sliding contact between the wire and the contact pad.

Example 27 includes the subject matter of example 26 wherein the contact pad deformation comprises the contact pad being bent downward about the wire extending through the contact pad.

Example 28 includes the subject matter of example 26 and further comprising multiple wiring layers having multiple contact pads, and wherein the wire extends through multiple contact pads in multiple layers.

Example 29 includes the subject matter of example 26 and further comprising multiple wires, each forming a sliding contact with one or more of the contacts in multiple layers.

Example 30 includes the subject matter of example 29 wherein at least one of the multiple wires is shorter than another of the multiple wires.

Example 31 includes the subject matter of example 29 wherein at least one of the multiple wires is wider than another of the multiple wires.

Example 32 includes the subject matter of example 26 and further comprising a die coupled to the wiring layer.

Example 33 includes the subject matter of example 26 and further comprising a printed circuit board coupled to the wiring layer.

Example 34 includes the subject matter of any of examples 25-32 wherein the wire comprises silver, copper, or gold.

Example 35 includes a device for forming wire connections, the device including a stencil having multiple openings to align multiple wires above an electronics package and means for moving the aligned wires into the electronics package to form electrical connections between contact pads and the wires.

Example 36 includes the subject matter of example 35 wherein the means for moving the aligned wires comprises plate configures to press against the stencil and apply force to the wires.

Example 37 includes the subject matter of example 35 wherein the stencil openings have different widths corresponding to different widths of wires.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of forming wire connections comprising:
 aligning a wire with a package body having a contact pad;
 moving the wire through the package body to form electrical contact with the contact pad; and
 deforming a tip of the wire during moving the wire as the tip of the wire contacts a rigid carrier.

2. The method of claim 1 wherein moving the wire through the package body forms electrical contact with multiple contact pads at different levels of the package body.

3. The method of claim 1 wherein the package body comprises dielectric material.

4. The method of claim 3 wherein the package body comprises an adhesion layer coupled to the package body, and wherein the wire is moved through the contact pad, a dielectric layer, and the adhesion layer to a rigid carrier supporting the package body.

5. The method of claim 3 and further comprising curing the dielectric material following the formation of the electrical contact with the contact pad.

6. The method of claim 1 wherein the wire has a tip with a reduced cross section on a portion of the wire first contacting the body package as the wire is moved through the body package.

7. The method of claim 1 wherein multiple wires are aligned with respect to multiple contact pads and moved through the package to form electrical contact with respective contact pads.

8. The method of claim 7 wherein at east one of the respective contact pads is on a different level of the package body.

9. The method of claim 1 wherein the wire is moved by pressing the wire through the package body.

10. The method of claim 1 wherein the wire is moved by shooting the wire through the package body.

11. A method of forming wire connections comprising:
 arranging wires in a stencil;
 aligning the stencil to position the wires above selected contact pads of a stack of multiple routing layers;
 moving the wires in the stencil to contact multiple contact pads on different routing layers; and
 removing the stencil.

12. The method of claim 11 wherein the wires are moved by applying pressure to a rigid plate contacting the stencil and wires.

13. The method of claim 12 wherein the wires comprise nails having heads, the method further comprising removing the heads after moving the wires and prior to removing the stencil.

14. An electronics package device comprising:
 a wiring layer having a contact pad, the wiring layer formed of a dielectric material; and
 a wire extending through the contact pad and the dielectric layer, the contact pad and the dielectric layer both being deformed about the wire, forming a sliding contact between the wire and the contact pad.

15. The device of claim 14 wherein the contact pad deformation comprises the contact pad being bent downward about the wire extending through the contact pad.

16. The device of claim 14 and further comprising multiple wiring layers having multiple contact pads, and wherein the wire extends through multiple contact pads in multiple layers.

17. The device of claim 14 and further comprising multiple wires, each forming a sliding contact with one or more of the contacts in multiple layers.

18. The device of claim 17 wherein at least one of the multiple wires is shorter than another of the multiple wires.

19. The device of claim 17 wherein at least one of the multiple wires is wider than another of the multiple wires.

20. A device for forming wire connections, the device comprising:
 a stencil having multiple openings to align multiple wires above an electronics package;
 means for moving the aligned wires into the electronics package to form electrical connections between contact pads and the wires; and
 a rigid carrier to deform a tip of one or more of the aligned wires.

21. The device of claim 20 wherein the means for moving the aligned wires comprises a plate configured to press against the stencil and apply force to the wires.

22. The device of claim 20 wherein the stencil openings have different widths corresponding to different widths of wires.

* * * * *

UNITED STATES PATENT AND TRADEMARK OFFICE
CERTIFICATE OF CORRECTION

PATENT NO. : 10,490,527 B2
APPLICATION NO. : 16/063145
DATED : November 26, 2019
INVENTOR(S) : Geissler et al.

Page 1 of 1

It is certified that error appears in the above-identified patent and that said Letters Patent is hereby corrected as shown below:

In the Claims

In Column 9, Line 42, in Claim 8, delete "east" and insert --least-- therefor

Signed and Sealed this
Thirtieth Day of June, 2020

Andrei Iancu
*Director of the United States Patent and Trademark Office*